United States Patent
Mekhanoshin et al.

(10) Patent No.: US 7,430,932 B2
(45) Date of Patent: Oct. 7, 2008

(54) DEVICE FOR TELEMONITORING THE STATE OF AERIAL POWER LINES(VARIANTS)

(76) Inventors: Boris Iosifovitch Mekhanoshin, Shenkursky proezd, d. 10, korp. V, kv. 17, Moscow, 127349 (RU); Vladimir Aleksandrovitch Shkaptsov, Leningradskoe shosse d. 15, kv. 177, Moscow, 126171 (RU)

( * ) Notice: Subject to any disclaimer, the term of this patent is extended or adjusted under 35 U.S.C. 154(b) by 0 days.

(21) Appl. No.: 10/533,285

(22) PCT Filed: Oct. 30, 2003

(86) PCT No.: PCT/RU03/00460

§ 371 (c)(1),
(2), (4) Date: Apr. 28, 2005

(87) PCT Pub. No.: WO2004/040239

PCT Pub. Date: May 13, 2004

(65) Prior Publication Data

US 2006/0060007 A1    Mar. 23, 2006

(30) Foreign Application Priority Data

Oct. 31, 2002   (RU) .............................. 2002129160

(51) Int. Cl.
*G01N 19/00* (2006.01)
(52) U.S. Cl. ................. 73/865.9; 340/310.18; 340/538; 340/310.11
(58) Field of Classification Search ................ 73/865.9; 340/287–309, 310.18, 538, 310.71
See application file for complete search history.

(56) References Cited

U.S. PATENT DOCUMENTS 4,420,752 A   12/1983   Davis (Continued)

*Primary Examiner*—Daniel S Larkin
*Assistant Examiner*—Rodney T Frank
(74) *Attorney, Agent, or Firm*—I. Zborovsky

(57) ABSTRACT

The invention refers to remote monitoring of power objects and is designed for collecting data on OHTL conductor status and passing such to data collection point (dispatch point for example).

The invention's objective is to exclude necessity to produce and maintain specialized technological applications for measuring conductor's attitude parameters and/or communication with measurements collection point, and thus improve reliability of the device operation as an autonomous element of system of monitoring of OHTL conductor status.

The device contains a housing, equipped with a mean for attachment to OHTL conductor, and located therein power supply and measuring-transmitting module. Invention options provide for introduction into the measuring-transmitting module of interface with utility cellular telephony channel and/or Global Positioning System signals receiver identifying its three-dimensional coordinates.

Measuring-transmitting module can be executed as control unit, unit of receipt and conversion of conductor status signal, unit of primary processing of obtained information, collection and storage of data, unit of communication and data transmission. In this case interface with utility cellular telephony channel and Global Positioning System signals receiver arc included in unit of communication and data transmission and in unit of receipt and conversion of conductor status signal, accordingly.

14 Claims, 2 Drawing Sheets

U.S. PATENT DOCUMENTS

| | | | |
|---|---|---|---|
| 4,689,752 A * | 8/1987 | Fernandes et al. | 700/292 |
| 4,709,339 A * | 11/1987 | Fernandes | 700/293 |
| 4,714,893 A * | 12/1987 | Smith-Vaniz et al. | 324/126 |
| 4,723,220 A * | 2/1988 | Smith-Vaniz | 702/62 |
| 4,746,241 A * | 5/1988 | Burbank, III | 403/344 |
| 4,758,962 A * | 7/1988 | Fernandes | 702/62 |
| 4,794,327 A * | 12/1988 | Fernandes | 324/126 |
| 4,794,328 A * | 12/1988 | Fernandes et al. | 324/127 |
| 4,799,005 A * | 1/1989 | Fernandes | 324/127 |
| 4,829,298 A * | 5/1989 | Fernandes | 340/870.27 |
| 4,904,996 A * | 2/1990 | Fernandes | 340/870.07 |
| 5,181,026 A * | 1/1993 | Granville | 340/870.28 |
| 6,072,396 A * | 6/2000 | Gaukel | 340/573.4 |
| 6,421,354 B1 * | 7/2002 | Godlewski | 370/466 |
| 2003/0218549 A1 * | 11/2003 | Logvinov et al. | 340/870.07 |

\* cited by examiner

DEVICE FOR TELEMONITORING THE STATE OF AERIAL POWER LINES(VARIANTS)

BACKGROUND OF THE INVENTION

The invention belongs to the remote monitoring of power facility objects, and is designed for obtaining data on status of overhead power transmission line (OHTL) conductor, and transmitting such to an information collection point (dispatch point). Controlled parameters of OHTL conductor status include, in particular, its temperature, current, tension (mechanical breaking load), as well as static and dynamic parameters of conductor's attitude: clearance to the ground, parameters of swing (due to wind), or galloping (auto-oscillations due to even wind effect on conductor with non-symmetric radial ice).

Monitoring results can be used for OHTL mode control aimed on reliable OHTL operation at the maximum usage of its load capacity.

SUMMARY OF THE INVENTION

A device is known [1], placed at OHTL conductor, containing temperature sensor and memorizing unit capable to measure conductor's temperature and store the measured values up to reading them using a PC. Limitations of the device [1] are: necessity to remove it from OHTL for reading measurement results, and limited set of parameters measured.

A portable device is known [2] that is a laser range meter capable of measuring distance between OHTL conductor and ground surface in a specified point (clearance to ground). Limitations of the device [2] are: required participation of operator who conducts and logs measurements, and limited set of parameters measured.

A portable device is known [3] that is a stationary system containing a laser range meter installed by OHTL span, that logs static and dynamic parameters of conductor status, including such events like swing and galloping if any. This device is in fact a modification of laser range meter [2], providing for monitoring conductor's dynamic behavior. Limitations of this device include its big size and requirement for permanent setup and service.

Common limitation of devices [1,2,3] is lack of means for transmitting data on conductor parameters measurement results to a control point, and therefore, impossibility to real-time monitor OHTL conductor status.

Known are devices [4] and [5] of real-time OHTL conductor parameters monitoring, equipped with data transmission moans.

Device [4] is installed at OHTL tower, and it is a sensor of conductor tension (mechanical load applied to suspension insulator), equipped with means of primary processing, storage and radio transmission of measurements results that provides for OHTL conductors tension real-time monitoring. Out of tension value measured by the device [4] other conductor status parameters can be computed.

Limitation of the device [4] is necessity to setup and maintain a specialized radio communication system, as well as low reliability and accuracy of data obtained. The latest is due to assessment of conductor's condition not via direct measurements of such parameters as temperature and positioning of conductor, but upon analysis of indirect features instead. Thus, conductor's temperature is indirectly assessed upon calculations using data on conductor's tension value, ambient temperature, wind velocity and conductor's current load as of the moment of measurement Conductor's positioning and clearance to ground can also be detected indirectly only, using data of conductor position under rated conditions, formulas and relations, describing connection of the monitored conductor tension value with sag.

Selected as a prototype device for remote monitoring of overhead power line conductor [5] contains a housing equipped with a mean for attachment to power line conductor, and located inside the housing power supply and measuring-transmitting module. Measuring-transmitting module of the device [5] includes a control unit, a unit for reception and conversion of conductor status signals, communication and data transmission unit. Output of the unit for reception and conversion of conductor status signals is connected to input of the communication and data transmission unit.

The prototype device is attached to OHTL conductor, operates as an autonomous element of the real-time OHTL conductor status monitoring system, ensuring data transmission via channel of specialized technological information system (it is recommended to setup such system in [5] based on the principles of HF communication via OHTL conductors, involving high voltage connecting modules [6]).

Limitation of the prototype is that special technical applications should he produced and maintained to allow its operation in the monitoring system.

This limitation is conditioned by the following. Device located at OHTL conductor as an autonomous measuring element of monitoring system, requires external means for implementing a function of measuring parameters of conductor status and/or communication with a point collecting measured information. For the prototype, additional special equipment should be introduced in the monitoring system (like, laser range meter [2], [3]and/or HF communication correspondingly), which failure or interruption in operation reduce both reliability of the monitoring system as a whole, and its autonomous measuring element.

SUMMARY OF THE INVENTION

The objective of invention is to exclude necessity of production and maintenance of specialized technological means for measuring conductor status parameters and/or communication with a point collecting measured information, and, thus improve reliability of the device operation as an autonomous element of OHTL conductor status monitoring.

Subject of the invention (option one) is a device for remote monitoring of OHTL conductor, containing housing equipped with a mean for attachment to power line conductor, and located inside the housing power supply and measuring-transmitting module interfaced with a utility cellular telephony channel.

Subject of the invention (option two) is also a device for remote monitoring of OHTL conductor, containing housing equipped with a mean for attachment to power line conductor, and located inside the housing power supply and measuring-transmitting module equipped with a Global Positioning System signals receiver identifying its three-dimensional coordinates.

Combination of the attributes of each of the above options of the invention allows improving reliability of the device operation as an autonomous element of OHTL conductor status monitoring.

The first option of the invention has a development that the measuring-transmitting module has a control unit, unit of receipt and conversion of conductor status signal, unit of primary processing of obtained information collection and storage of data, unit of communication and data transmission, while unit of primary processing of obtained information, collection and storage of data is connected to input of unit of communication and data transmission and to output of unit of receipt and conversion of conductor status signal, and interface with a utility cellular telephony channel is introduced in unit of communication and data transmission.

Another development of the first option of the invention is that a Global Positioning System signals receiver identifying its three-dimensional coordinates is introduced in the measuring-transmitting module.

This allows monitoring static and dynamic parameters of conductor positioning parameters keeping the reliability of the device's autonomous operation.

The second option of the invention has a development that the measuring-transmitting module has a control unit, unit of receipt and conversion of conductor status signal, unit of primary processing of obtained information, collection and storage of data, unit of communication and data transmission, while unit of primary processing of obtained information, collection and storage of data is connected to output of unit of receipt and conversion of conductor status signal and to input of unit of communication and data transmission, and Global Positioning System signals receiver identifying its three-dimensional coordinates is introduced in unit of receipt and conversion of conductor status signal.

The second option of the invention has another development that the measuring-transmitting module is interfaced with a utility cellular telephony channel.

This allows additional improving the reliability of the device's autonomous operation on the second option of invention.

Both options have additional developments:
unit of receipt and conversion of conductor status signal contains a sensor of current values in conductor;
unit of receipt and conversion of conductor status signal contains a sensor of conductor temperature that may be mounted in the mean of the housing attachment to power line conductor;
unit of communication and data transmission is equipped with means of receipt of data inquiry signals, setting digital data, and unauthorized access protection.

This would provide required sets of monitored parameters of conductor status and operational abilities of device in particular device options.

Both options of the invention have other developments that power supply can be provided as a battery chargeable from power line current and/or additionally provided solar battery.

This allows additional improving the reliability of the device's autonomous operation.

DESCRIPTION OF THE PREFERRED EMBODIMENTS

Figure 1:
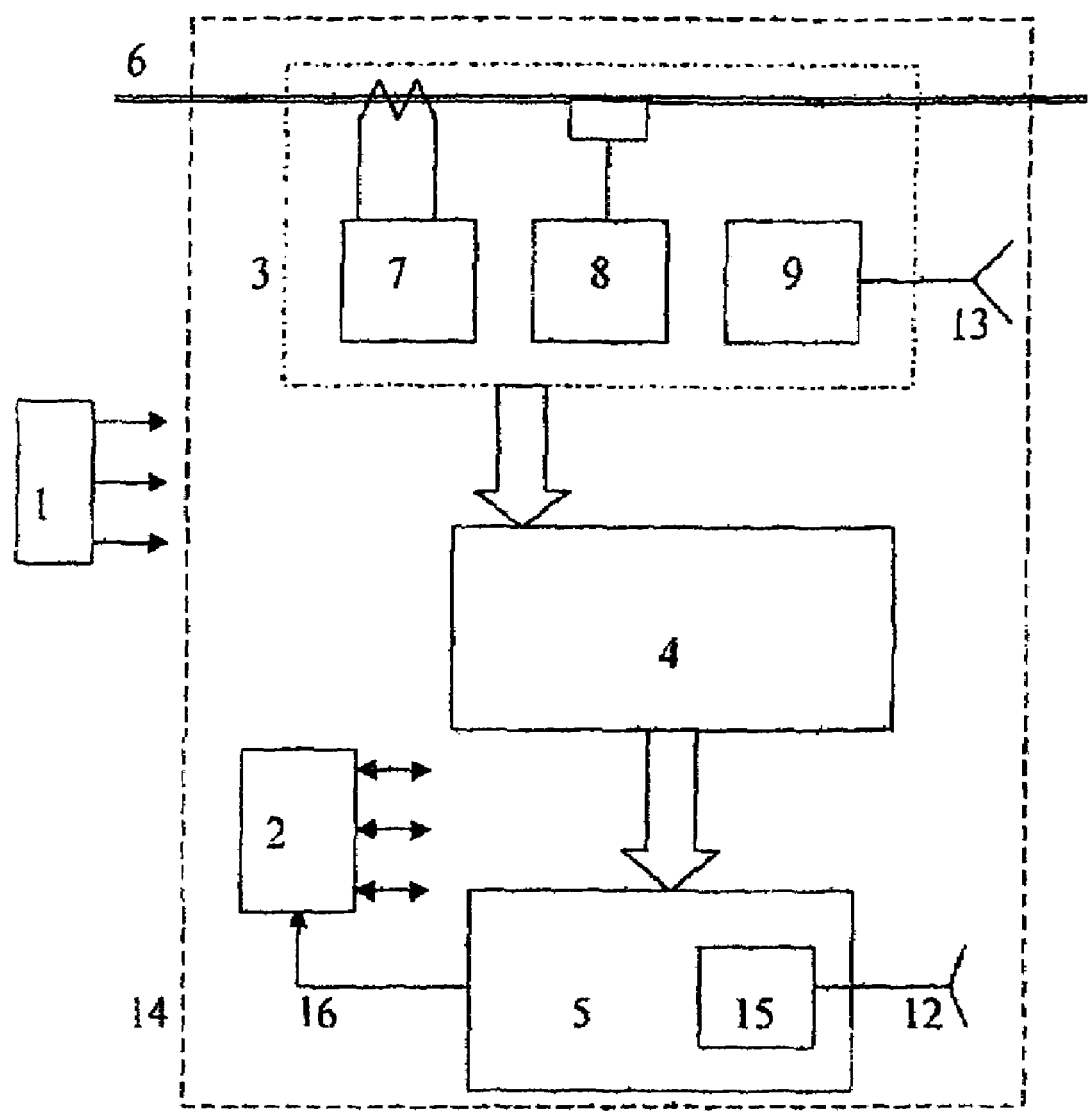
FIG. 1 shows functional pattern of the device considering its development.

FIG. 1 shows:
1—power supply,
2—control unit,
3—unit of receipt and conversion of conductor status signal,
4—unit of primary processing of obtained information collection and storage of data,
5—unit of communication and data transmission,
6—OHTL conductor.

Unit 1 can be done as a battery chargeable from OHTL current, and/or solar battery, in this case to be included in the device's set (not shown on FIG. 1).

Unit 2 controls operation of units 3, 4, 5, and device as a whole.

Unit 3 includes:
7—sensor of parameters of current in conductor 6,
8—sensor of temperature of conductor 6,
9—Global Positioning System signals receiver identifying its three-dimensional coordinates (GPS receiver).

Figure 2:
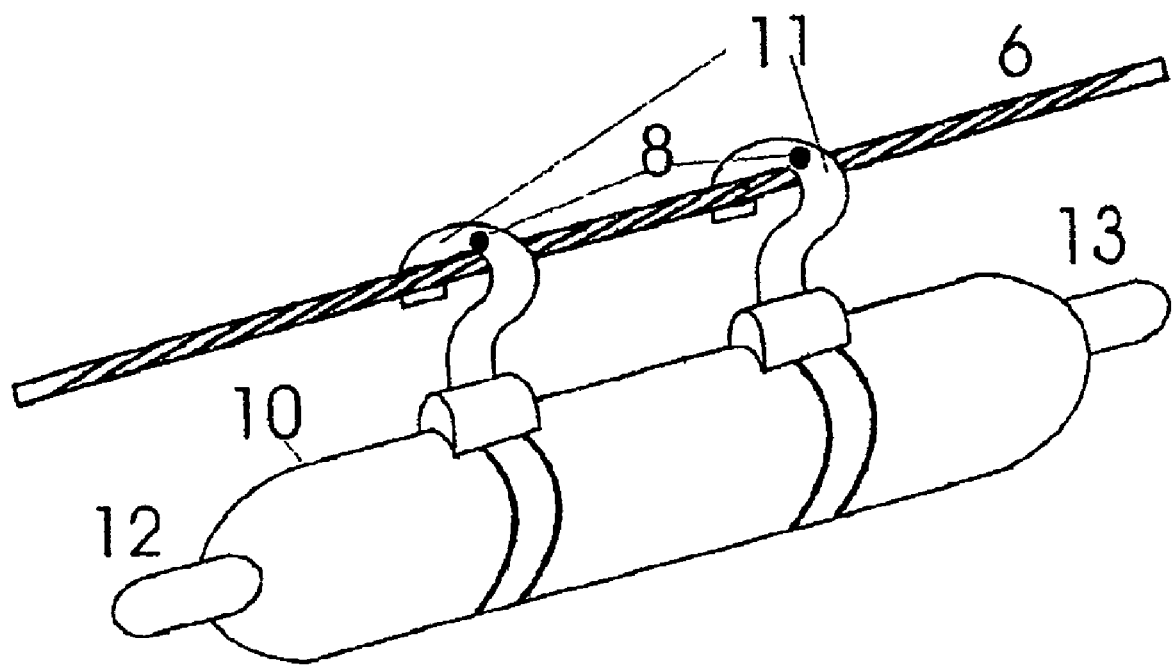
FIG. 2 shows general view of the device installed at OHTL conductor.

FIG. 2 shows:
10—housing of device,
11—means of attachment of housing 10 to conductor 6,
12 and 13—antennas of unit 5 and receiver 9, as well as conductor 6 and sensor 8 mounted inside means 11 (sensor 7 on FIG. 2 is not shown, and sensor 8 consists of two parts).

Unit 4 is connected to the output of unit 3 and input of unit 5, and it performs primary processing of obtained information, collection and storage of data.

Unit 5 ensures communication and data transmission to the point of measurements collection.

Units 2, 4 and 5 can be executed on a basis of microprocessor technique with a program control, and be structurally combined with unit 3 in a united measuring-transmitting module 14.

Interface 15 with utility cellular telephony channel that module 14 is equipped with, is shown on FIG. 1 within unit 5 set. Unit 5 can he also equipped with means of receipt of data inquiry signals, setting digital data, and unauthorized access protection, not shown on FIG. 1.

Sensor 7 operates as current transformer and can be structurally executed similar to, for example, a clamp-on meter.

Sensor 8 can be executed on a basis of one or two thermocouples, incorporated (see FIG. 2) into means 11 of housing 10 attachment to conductor 6.

Receiver 9, which module 14 is equipped with, is shown on FIG. 1 within unit 3. Receiver 9 can be executed on a basis of commercially available GPS receiver chip.

Antennas 12 and 13 are connected to unit 5 and receiver 9 accordingly, and ensure their operations.

The device is directly attached to OHTL conductor in a span preferably in span middle, or at max. sag point, and operates as below.

Using sensor 8, unit 3 receives analogue electric signal corresponding to temperature of conductor 6, converts it into digital data and transmits to unit 4 where it is stored, collected and primary processed.

Using sensor 7, unit 3 receives analogue electric signal corresponding to current of line (carrying data on current value, frequency, phase etc.), converts it into digital data and transmits to unit 4 where it is stored, collected and primary processed.

Using receiver 9, unit 3 receives signals from Global Positioning System, GPS satellites. [7]. Receiver 9 is equipped with analyzer of GPS signals that out of their relative delays (approximately once per microsecond) acquires the receiver's position in three-dimensional coordinate system. Data on receiver's 9 (and, therefore, conductor's 6) coordinates pass from unit 3 to unit 4, where it is, similarly with other parameter's stored, collected and primary processed. Certain increase of the receiver's resolution capacity is ensured in this case, that allows measuring relatively small moves of OHTL conductor using GPS system initially designed for mobile objects' positioning. Such effect is due to receiver's long-time receipt of GPS signals being basically stationery, before any intense swings occur.

From unit 4 the data pass to unit 5 ensuring transmission to the control point of status data (temperature, current and attitude) of tie conductor.

In those options of the invention execution where module 14 is equipped with a mean 15 (modem), data transmission is conducted via utility cellular telephony channels. Data may be transmitted periodically with a, for instance, 15 minute interval, or on inquiry from the information collection and processing point. In a latter case, unit 5 should have means of receipt of data inquiry signals and may be connected to unit 2 with a circuit 16 initiating operation of the device.

At the information collection and processing point, receipt of data and control signals transmission (inquiry for transmission and settings data) can either be executed using a specialized device, or personal computer, which interface with communication channel may be arranged via regular telephone line using a standard modem.

The offered device utilizes the known utility means (GPS signals and cellular telephone channels) for solving specific task of monitoring OHTL conductor's parameters status.

The cellular communication here is used not on its direct purpose (providing telephony for mobile subscribers), but for ensuring telephone connection with an object located under high voltage conditions. Technical effect of cellular communication usage in the invention is that there is no necessity to create and maintain both means of high voltage decoupling, and specialized communication system. Plus, reliability of the device's autonomous operation grows, since operation of utility telephone network (including cellular) usually continues in case of failure or interruption of separate lines, high voltage substations, power plants, and even power utilities.

It is important to mention that known from, for example [8], usage of mobile telephony in household appliances remote control, does not provide for data transmission directly from elements (sensors) installed on current conducting (moreover high voltage) parts of equipment, and, therefore, is not accompanied with the above technical result. In [8] a different task is solved and a different technical result is achieved (usage of ready and available mean—mobile phone, as a remote system terminal), based on such property of mobile phones as a display suitable for indication of control instructions and results of household appliances control.

Inventive level of the offer is also confirmed by [9], describing a system of monitoring parameters of electric power objects in hard-to-reach locations (on high voltage and rotating parts of equipment), while not considering usage of cellular telephony channels for this purpose.

INDUSTRIAL APPLICABILITY

The invention's applicability presumes meeting at least one of the two requirements to device's location on OHTL:
  It should be inside of at least one mobile operator coverage area.
  It should provide for receipt of at least 3 GPS constellation satellites signals at a time, out of the total count of 21 orbital objects.

Currently the first requirement is mostly met in developed areas with high population density, and the second one (due to large total number of GPS constellation orbital objects, evenly located on orbit around Earth)—in virtually any point of Earth surface.

Meeting the first requirement allows application of the invention in its first execution option, and meeting the second—in the second one. In both cases, technical result of the invention is ensured —improving reliability of the device's autonomous operation.

On the other hand, choice of the invention execution option may be determined by economic considerations and priority task for OHTL conductor status monitoring, depending, for instance, on presence of icy critical sections, strength and direction of prevailing wind at OHTL route, load on line.

Thus, depending on specific OHTL conditions, the offered device may be executed in two general options, each providing for appropriate development in the future with further increase of reliability and operative autonomy, should both of the above requirements be met at the device's location.

INFORMATION SOURCES

1. Mobile autonomous thermal recorder RTV-1, www.carat-ndt.ru/rtv2.htm
2. Laser range finder LEM 300-GEO, www.jenoptik-los.de/lasersensor/range finder/lem300 geo.html.
3. M. Corti, S. Marazzini, F. Tavano. Misura a distanza delle vibrazioni dei conduttori delle linee elettriche aeree mediante l'impiego di laser, 85a Riunione Annuale dell'AEI, ottobre 1984.
4. T. Seppa et all, Use of on-line tension monitoring for real-time thermal rating, ice loads, and other environmental effects, CIGRE Session 1998, report 22-102.
5. Patent of Russia No RU 2143165, MPK H02J 13/00, G01R 15/06, 1999, Device for Electric Power Systems Monitoring.
6. Mikutsky G. V. Devices for processing and connecting of HF channels Moscow, Energiya, 1974, p. 106-158.
7. Understanding GPS; principles and applications. Edition Elliot D. Kaplan, Arteeh Hons. Boston, London, 1996.
8. Application RST No WO 01/28068, H02I 13/00, 2001, System for monitoring and controlling of set of household appliances.
9. Application RST No WO 01/17092, MPK H02J 13/00, 2001, Electric power supervision.

The invention claimed is:

1. A device for remote monitoring of an overhead power transmission line conductor, comprising a housing provided with means for attaching on the overhead power transmission line conductor; and arranged in said housing a power supply, a sensor of temperature of the conductor, and a measuring-transmitting module configured to receive signals from said sensor of temperature of the conductor, to convert them into digital data and to transmit the digital data for storing, collecting and processing, wherein said measuring-transmitting module includes a control unit, a unit for receipt and conversion of a conductor status signals, a unit for primary processing of obtained information, collection and storage of data, a unit for communication and data transmission, wherein said unit for primary processing of obtained information, collection and storage of data is connected to an input of said unit for communication and data transmission and to an output of said unit for receipt and conversion of conductor status signals, and said means for interfacing with a utility cellular telephonic channel is included in said unit for communication and data transmission.

2. A device for remote monitoring of an overhead power transmission line conductor, comprising a housing provided with means for attaching on the overhead power transmission line conductor; and arranged in said housing a power supply, a sensor of temperature of the conductor, and a measuring-transmitting module configured to receive signals from said sensor of temperature of the conductor, to convert them into digital data and to transmit the digital data for storing, collecting and processing, wherein said measuring-transmitting module is configured to receive signals from a Global Positioning System, to obtain data about a position of the transmission line conductor module in a three-dimensional coordinate system, to correct the data, and to transmit the data for collecting of measuring information.

3. A device for remote monitoring of an overhead power transmission line conductor, comprising a housing provided with means for attaching on the overhead power transmission line conductor; and arranged in said housing a power supply, a sensor of temperature of the conductor, and a measuring-transmitting module configured to receive signals from said sensor of temperature of the conductor, to convert them into digital data and to transmit the digital data for storing, collecting and processing, wherein said sensor of conductor temperature is incorporated in said means for attaching said housing to the overhead power transmission line conductor.

4. A device for remote monitoring of an overhead rower transmission line conductor, comprising a housing provided with means for attaching on the overhead power transmission line conductor; and arranged in said housing a power supply, a sensor of temperature of the conductor, and a measuring-transmitting module configured to receive signals from said sensor of temperature of the conductor, to convert them into digital data and to transmit the digital data for storing, collecting and processing, wherein said unit for communication and data transmission is provided with means for receipt of data inquiry signals, setting digital data, and unauthorized access protection; and further comprising a solar battery, said battery being chargeable from said solar battery.

5. A device as defined in claim 4, wherein said module is configured to receive signals from a sensor of current values in the conductor and to convert them into digital data.

6. A device as defined in claim 4, wherein said module is configured to receive signals from a sensor of conductor temperature and convert them into digital data.

7. A device as defined in claim 4, wherein said module is provided with means for receipt of data inquiry signal, setting digital data, and unauthorized access protection.

8. A device as defined in claim 4 wherein said power supply is configured as a battery.

9. A device as defined in claim 7, wherein said battery has means for charging from an overhead power transmission line current.

10. A device for remote monitoring of an overhead power transmission line conductor, comprising a housing providing with means for attaching to the overhead power transmission line conductor; and arranged in said housing a power supply arranged in said housing, a measuring-transmitting module configured to receive signals from a Global Positioning System, to determine a position of said module in three-dimensional coordinates, and to transmit data about coordinates for collection of measuring information.

11. A device as defined in claim 10, wherein said measuring-transmitting module includes a control unit, a unit of receipt and conversion of conductor status signal with a receiver of signals of the Global Positioning System, a unit for primary processing of obtained information, collection and storage of data, and a unit for communication and data transmission, wherein said unit for primary processing and obtained information, collection and storage data is connected to an output of the unit for receipt and conversion of conductor status signal and to an input of a unit of said unit of communication and data transmission.

12. A device as defined in claim 11, wherein said measuring-transmitting module is provided with means for interfacing with a utility cellular telephonic channel.

13. A device as defined in claim 12; and further comprising means for attaching said housing to the overhead power transmission line conductor, said sensor of conductor temperature being incorporated in said means for attaching said housing to the overhead power transmission line conductor.

14. A device as defined in claim 13; and further comprising a solar battery, said battery being chargeable form said solar battery.

\* \* \* \* \*